United States Patent
Lee et al.

(10) Patent No.: US 8,183,678 B2
(45) Date of Patent: May 22, 2012

(54) SEMICONDUCTOR DEVICE HAVING AN INTERPOSER

(75) Inventors: Choon Heung Lee, Seoul (KR); Ki Cheol Bae, Seoul (KR); Do Hyun Na, Seoul (KR)

(73) Assignee: AMKOR Technology Korea, Inc., Seoul (KR)

( * ) Notice: Subject to any disclaimer, the term of this patent is extended or adjusted under 35 U.S.C. 154(b) by 350 days.

(21) Appl. No.: 12/535,316

(22) Filed: Aug. 4, 2009

(65) Prior Publication Data

US 2011/0031598 A1 Feb. 10, 2011

(51) Int. Cl.
*H01L 25/065* (2006.01)
*H01L 23/52* (2006.01)
*H01L 21/50* (2006.01)

(52) U.S. Cl. ......... 257/686; 257/E23.141; 257/E25.013; 257/E21.705; 257/777; 257/723; 257/737; 257/738; 257/734; 257/778

(58) Field of Classification Search .................. 257/686, 257/724, 698, E23.141, E25.013, E21.705, 257/777, 723, 737, 738, 734, 778
See application file for complete search history.

(56) References Cited

U.S. PATENT DOCUMENTS

| | | | | |
|---|---|---|---|---|
| 6,104,082 A | * | 8/2000 | Berlin et al. | 257/665 |
| 6,137,161 A | * | 10/2000 | Gilliland et al. | 257/678 |
| 7,378,733 B1 | * | 5/2008 | Hoang et al. | 257/724 |
| 7,696,006 B1 | * | 4/2010 | Hoang et al. | 438/107 |
| 7,863,524 B2 | * | 1/2011 | Shioga et al. | 174/260 |
| 7,936,060 B2 | * | 5/2011 | Andry et al. | 257/691 |
| 2002/0132533 A1 | * | 9/2002 | Figueroa | 439/862 |
| 2004/0067605 A1 | * | 4/2004 | Koizumi | 438/108 |
| 2004/0257749 A1 | * | 12/2004 | Otsuka et al. | 361/306.3 |
| 2006/0012966 A1 | * | 1/2006 | Chakravorty | 361/763 |
| 2006/0092595 A1 | * | 5/2006 | Hwa Lee et al. | 361/306.3 |
| 2006/0228855 A1 | * | 10/2006 | Min et al. | 438/240 |
| 2007/0291448 A1 | * | 12/2007 | Cornelius | 361/684 |
| 2008/0054429 A1 | * | 3/2008 | Bolken et al. | 257/686 |
| 2008/0247116 A1 | * | 10/2008 | Kawano et al. | 361/302 |
| 2008/0296697 A1 | * | 12/2008 | Hsu et al. | 257/379 |
| 2009/0079454 A1 | * | 3/2009 | Knickerbocker | 324/760 |
| 2011/0096521 A1 | * | 4/2011 | Randall et al. | 361/782 |

* cited by examiner

*Primary Examiner* — A O Williams
(74) *Attorney, Agent, or Firm* — Workman Nydegger

(57) ABSTRACT

A semiconductor device and a method of fabricating the same. An interposer used for the semiconductor device includes integrated circuits therein to realize the functions of a decoupling capacitor, an ESD preventing circuit, an impedance matching circuit, and termination. The semiconductor device may include a semiconductor die with a through silicon via (TSV) structure having two or more through electrodes that pass through the semiconductor die, in which each of the through electrodes are connected to a respective bond pad of the semiconductor die.

13 Claims, 6 Drawing Sheets

SEMICONDUCTOR DEVICE HAVING AN INTERPOSER

BACKGROUND OF THE INVENTION

1. Field of the Invention

The present invention relates to a semiconductor device including an interposer and a method of fabricating the same.

2. Description of the Related Art

Since recent semiconductor devices are required to have high capcities and high performance, in constituting one semiconductor device, a plurality of semiconductor dies are stacked in many cases. When the semiconductor dies are stacked, it is difficult to supply electric power from a lower substrate to upper semiconductor dies, which causes the semiconductor dies to malfunction.

When static electricity is induced to the semiconductor device in the case where a human body touches the semiconductor device, the static electricity causes electrostatic discharge (ESD) to the semiconductor device. Since the ESD occurs at a high voltage, the ESD may damage the internal elements of the semiconductor device.

In addition, there are various parasitic components in the semiconductor device. The parasitic components delay or prohibit the transmission of signals to prevent the semiconductor device from immediately operating.

BRIEF SUMMARY OF THE INVENTION

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
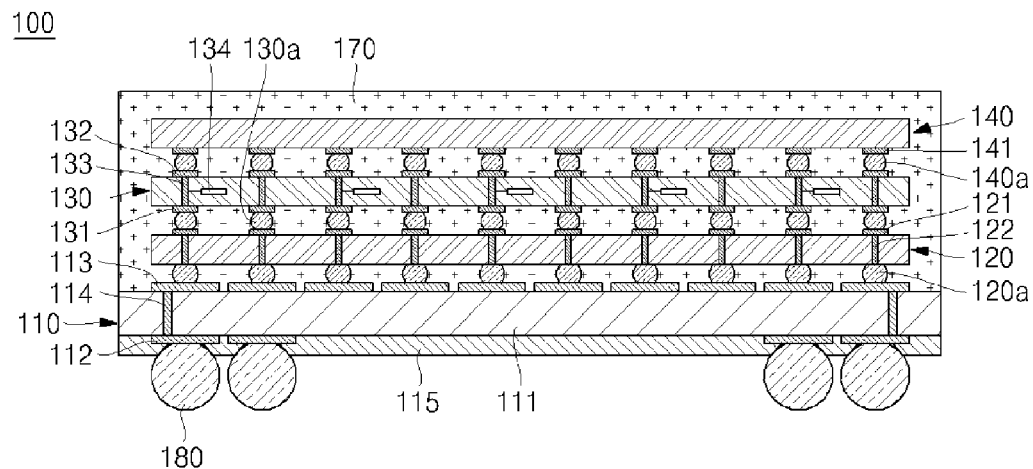
FIG. 1 is a sectional view illustrating a semiconductor device according to an embodiment of the present invention.

Referring to FIG. 1, a sectional view of a semiconductor device 100 according to an embodiment of the present invention is illustrated.

As illustrated in FIG. 1, the semiconductor device 100 according to an embodiment of the present invention includes a substrate 110, a first semiconductor die 120 formed on the substrate 110, an interposer 130 formed on the substrate 110, a second semiconductor die 140 formed on the interposer 130, an encapsulant 170 formed to surround the first semiconductor die 120, the interposer 130 and the second semiconductor die 140, and solder balls 180 formed under the substrate 110.

The substrate 110 provides a basis of the semiconductor device 100 according to an embodiment of the present invention. The substrate 110 includes lands 112 formed on the lower surface of an insulating layer 111, a plurality of conductive patterns 113 formed on the insulating layer 111, conductive vias 114 penetrating the insulating layer 111 to connect the lands 112 to the conductive patterns 113, and a solder mask 115 insulating the regions excluding the regions in which the lands 112 are formed.

The insulating layer 111 is plate-shaped. The insulating layer 111 is made of an electrically insulating material such as thermosetting resin, polyimide, and polymer and primarily insulates electric elements on the insulating layer 111 from the outside.

At least one or more lands 112 are provided under the insulating layer 111. In the land grid array (LGA) type, the lands 112 are electrically connected to an external circuit. In the ball grid array (BGA), the lands 112 are electrically connected to the external circuit through the solder balls 180. The lands 112 are commonly made of copper having high conductivity or an equivalent thereof.

The conductive patterns 113 are formed on the insulating layer 111. The conductive patterns 113 are electrically connected to the first semiconductor die 120, the interposer 130, and/or the second semiconductor die 140. The conductive patterns 113 are commonly made of copper having high conductivity or an equivalent thereof.

The conductive vias 114 penetrate the insulating layer 111 and electrically connect the lands 112 to the conductive patterns 113. The conductive vias 114 may be formed by filling metal in via holes in forming the conductive patterns 113.

The solder mask 115 is formed on the lower surface of the insulating layer 111. The solder mask 115 covers the regions excluding the regions in which the lands 112 are exposed to insulate the exclusive regions. The solder mask 115 is made of benzocyclobutene (BCB) resin having high insulativity, polyimide, and an equivalent thereof.

The first semiconductor die 120 is formed on the substrate 110 using conductive bumps 120a. The first semiconductor die 120 has a through silicon via (TSV) structure. That is, the first semiconductor die 120 includes a plurality of bond pads 121 formed on one surface of the first semiconductor die 120 and through electrodes 122 that pass through the semiconductor die 120.

The bond pads 121 are formed on the first semiconductor die 120. For convenience sake, the bond pads 121 are illustrated to protrude above the first semiconductor die 120. However, the bond pads 121 may be actually formed inside the first semiconductor die 120. In addition, the active surface of the first semiconductor die 120, on which the bond pads 121 are formed, is illustrated to face upward, however, may be flipped if necessary.

The through electrodes 122 pass through the first semiconductor die 120. The through electrodes 122 are connected to correspond to the bond pads 121. Therefore, an electric signal can be transmitted to the bond pads 121 from the lower surface of the first semiconductor die 120. The through electrodes 122 are connected to the conductive bumps 120a to transmit the electric signal to the first semiconductor die 120.

The interposer 130 is formed on the substrate 110. The interposer 130 is formed on the first semiconductor die 120 using conductive bumps 130a to be electrically connected to the bond pads 121. The interposer 130 includes first regions 131 formed on the lower side thereof, second regions 132 formed thereon, conductive vias 133 for connecting the first regions 131 and the second regions 132 to each other, and integrated circuits 134 connected to the conductive vias 133.

The plurality of first regions 131 are formed on the lower side of the interposer 130. The first regions 131 are connected to the bond pads 121 of the first semiconductor die 120 through the conductive bumps 130a to input and output the electric signal. The first regions 131 are made of copper having high conductivity or an equivalent thereof.

The plurality of second regions 132 are formed on the interposer 130. The second regions 132 are formed vertically on the first regions 131 to correspond to the first regions 131. The second regions 132 are also formed of copper having high conductivity or an equivalent thereof.

The conductive vias 133 are formed to pass through the interposer 130 to electrically connect the first regions 131 and the second regions 132 to each other. The conductive vias 133 may be formed by filling metal in the via holes in forming the second regions 132.

The at least one or more integrated circuits 134 are electrically connected to the conductive vias 133. Each of the integrated circuits 134 has a plurality of layers in the interposer 130 to perform individual functions.

For example, the integrated circuits 134 may constitute a decoupling capacitor. The semiconductor device 100 according to the embodiment of the present invention includes a second semiconductor die 140 provided on the first semiconductor die 120. In the structure where semiconductor dies are stacked, since the second semiconductor die 140 provided on the first semiconductor die 120 is far from the substrate 110, it is more difficult for the second semiconductor die 140 to receive electric power than the first semiconductor die 120. Therefore, the integrated circuits 134 of the interposer 130 as decoupling capacitors are provided between the first semiconductor die 120 and the second semiconductor die 140 to store the energy at the voltage applied from the substrate 110. The energy stored in the integrated circuits 134 is applied to the second semiconductor die 140 so that a constant voltage can be applied to the second semiconductor die 140 and that the reliability of operation can be improved.

On the other hand, the integrated circuits 134 may constitute an electrostatic discharge (ESD) protection circuit. When a high voltage is instantaneously induced by the electrostatic discharge generated in the case where a human body touches a semiconductor device, the internal elements of the semiconductor device may be damaged. When the static electricity is generated, the integrated circuits 134 absorb the static electricity to prevent the electrostatic from being discharged.

In addition, the integrated circuits 134 may constitute an impedance matching circuit. There are various parasitic components in the first semiconductor die 120 or the second semiconductor die 140 in accordance with the structure of the first semiconductor die 120 or the second semiconductor die 140 and the transmission of a signal may be delayed. Therefore, the integrated circuits 134 perform phase compensation for the parasitic components through impedance matching.

In addition, the integrated circuits 134 may constitute a termination. When resistance between the first semiconductor die 120 and the second semiconductor die 140 is not properly matched, it is difficult that a signal is reflected and is correctly transmitted to the second semiconductor die 140. Therefore, the integrated circuits 134 constitute the termination of the resistance component so that the electric signal of the first semiconductor die 120 can be transmitted to the second semiconductor die 140 without distortion.

The plurality of integrated circuits 134 perform one function selected from the functions, respectively. The integrated circuits 134 are electrically connected to the second semiconductor die 140 through the second regions 132 connected through the conductive vias 133. In addition, in the second regions 132, wiring lines are previously formed to the second semiconductor die 140 by fuses. Among the wiring lines, unnecessary wiring lines are removed by laser so that only some of the integrated circuits 134 may be connected to the second semiconductor die 140.

The second semiconductor die 140 is formed on the interposer 130 and is electrically connected to the interposer 130 through conductive bumps 140a. Bond pads 141 are provided on one surface of the second semiconductor die 140. The second semiconductor die 140 is provided in the form of a flip-chip such that the bond pads 141 face downward. The second semiconductor die 141 is connected to the second regions 132 of the interposer 130 to electrically transmit and receive a signal to and from the first semiconductor die 120 and the substrate 110.

FIG. 1 illustrates the bond pads 141 of the second semiconductor die 140 to be flipped to face downward. However, the second semiconductor die 140 may have a through silicon via (TSV) structure and may be formed such that the bond pads 141 face upward.

The encapsulant 170 is formed on the substrate 110. The encapsulant 170 encapsulates the first semiconductor die 120, the interposer 130, and the second semiconductor die 140. The encapsulant 170 protects the internal elements. To this end, the encapsulant 170 may be made of one selected from the group consisting of common epoxy resin, silicon resin, and equivalents thereof.

The solder balls 180 are formed on the lower surface of the substrate 110 in the form of a ball to be electrically connected to the lands 112. The solder balls 180 are electrically connected to an external circuit so that an electric signal can be input to and output from the first semiconductor die 120, the interposer 130, and the second semiconductor die 140. The solder balls 180 may be made of a solder material.

By doing so, in the semiconductor device 100 according to the embodiment of the present invention, the integrated circuits 134 that perform the functions of the decoupling capacitor, the ESD preventing circuit, the impedance matching circuit, and the termination are formed in the interposer 130. Therefore, electric power can be smoothly supplied to the second semiconductor die 140, the semiconductor device 100 can be protected from the ESD, and a signal can be smoothly transmitted so that the reliability of operation can be guaranteed.

Hereinafter, the structure of a semiconductor device 200 according to another embodiment of the present invention will be described. The parts having the same structures and operations are denoted by the same reference numerals. Hereinafter, differences from the above-described embodiment will be mainly described.

Figure 2:
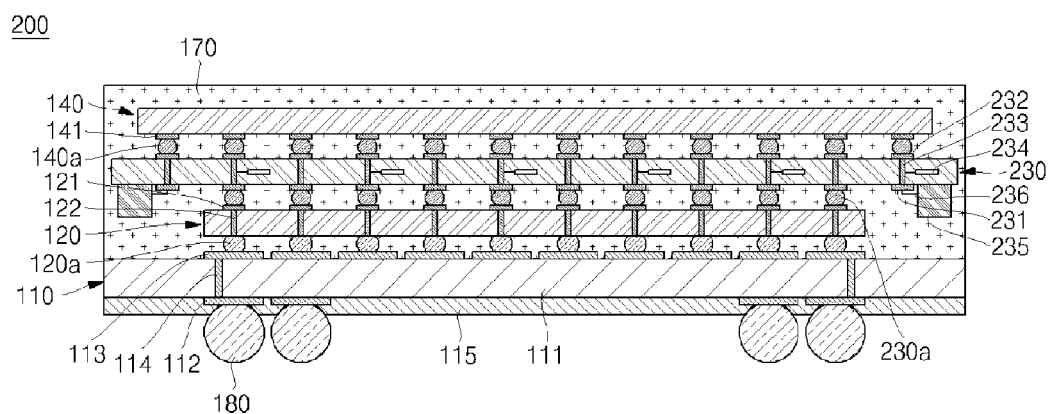
FIG. 2 is a sectional view illustrating a semiconductor device according to another embodiment of the present invention.

Referring to FIG. 2, a sectional view of the semiconductor device 200 according to another embodiment of the present invention is illustrated.

As illustrated in FIG. 2, the semiconductor device 200 according to another embodiment of the present invention includes a substrate 110, a first semiconductor die 120, an interposer 230 formed on the substrate 110, a second semiconductor die 140, an encapsulant 170, and solder balls 180.

The interposer 230 is formed on the first semiconductor die 120 using conductive bumps 230a. The interposer 230 is larger than the first semiconductor die 120. The interposer 230 includes first regions 231 formed on the lower surface of the interpose, second regions 232 formed thereon, conductive vias 233 connecting the first regions 231 and the second regions 232 to each other, and integrated circuits 234 connected to the conductive vias 233.

In addition, the interposer 230 further includes passive elements 235 formed on the lower surface thereof. The passive elements 235 are electrically connected to the first regions 231 through conductive bumps 236.

The passive elements 235 can realize parts of the functions of the integrated circuits 234 and can constitute various other elements of the semiconductor device 200 according to another embodiment of the present invention. The passive elements 235 may be so complicated that the passive elements 235 cannot be realized by the first semiconductor die 120 and the second semiconductor die 140. In this case, when the number of processes of the semiconductor dies is reduced, fabrication cost can be reduced. In addition, in order to provide the passive elements 235, the interposer 230 is larger than the first semiconductor die 120. Therefore, since the second semiconductor die 140 formed on the interposer 230 can be larger than the first semiconductor die 120, the restriction on the size of the semiconductor die 140 can be reduced.

Hereinafter, the structure of a semiconductor device 300 according to still another embodiment of the present invention will be described.

Figure 3:
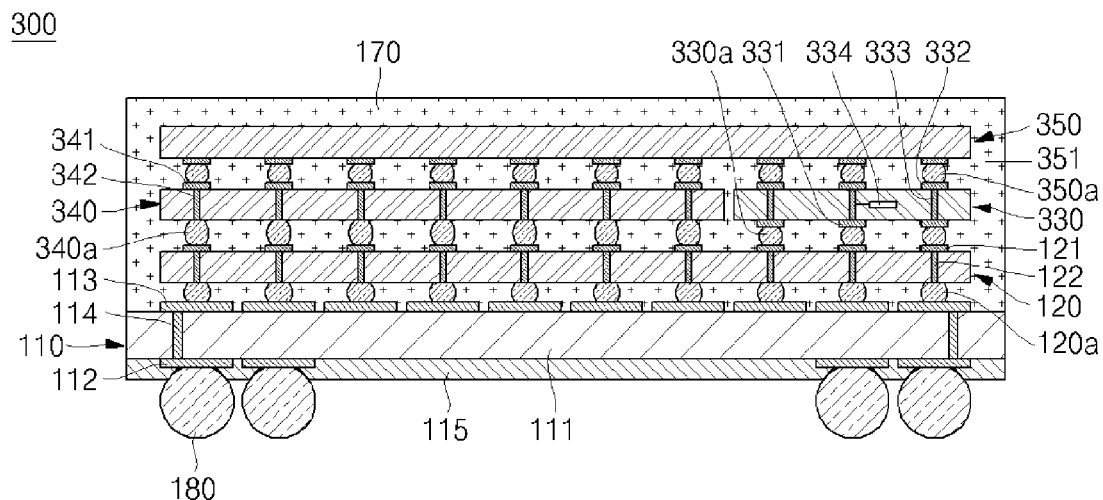
FIG. 3 is a sectional view illustrating a semiconductor device according to still another embodiment of the present invention.

Referring to FIG. 3, a sectional view of a semiconductor device 300 according to still another embodiment of the present invention is illustrated.

As illustrated in FIG. 3, the semiconductor device 300 according to still another embodiment of the present invention includes a substrate 110, a first die 120, an interposer 330 formed on the first semiconductor die 120, a second semiconductor die 340 formed on the first semiconductor die 120, a third semiconductor die 350 formed on the second semiconductor die 340, an encapsulant 170, and solder balls 180.

The interposer 330 is formed on one side of the first semiconductor die 120. In the interposer 330, first regions 331 provided on the lower surface of the interposer 330 are connected to the bond pads 121 of the first semiconductor die 120 through conductive bumps 330a. Integrated circuits 334 are electrically connected to conductive vias 333 for connecting the first regions 331 and second regions 332 to each other to function as the decoupling capacitor, the ESD preventing circuit, the impedance matching circuit, and the termination that are described above.

The interposer 330 divides the upper region of the first semiconductor die 120 from the second semiconductor die 340. As a result, the interposer 330 supports the third semiconductor die 350 together with the second semiconductor die 340. Therefore, when the third semiconductor die 350 larger than the second semiconductor die 340 is stacked, the third semiconductor die 350 is stably supported so that the physical force applied to the second semiconductor die 340 can be reduced.

The second semiconductor die 340 is formed on one side of the first semiconductor die 120. Bond pads 341 are provided on the second semiconductor die 340. The second semiconductor die 340 is electrically connected to the first semiconductor die 120 through electrodes 342 connected to conductive bumps 340a. The second semiconductor die 340 is illustrated to be smaller than the first semiconductor die 120 and to run parallel with the interposer 330. In addition, the second semiconductor die 340 may be flipped so that the surface on which the bond pads 341 are formed faces downward.

The third semiconductor die 350 is formed on the interposer 330 and the second semiconductor die 340. The third semiconductor die 350 is supported by the interposer 330 and the second semiconductor die 340. The third semiconductor die 350 is provided in the form of a flip chip so that bond pads 351 face downward and is connected to the second regions 332 of the interposer 330 through conductive bumps 350a. In addition, the third semiconductor die 350 has a TSV structure such that the bond pads 351 may face upward.

Hereinafter, the structure of a semiconductor device 400 according to still another embodiment of the present invention will be described.

Figure 4:
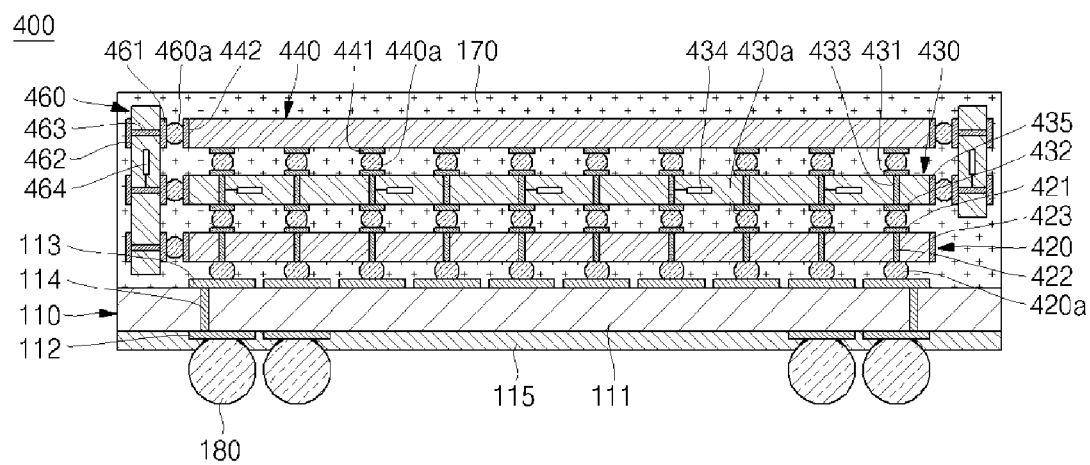
FIG. 4 is a sectional view illustrating a semiconductor device according to still another embodiment of the present invention.

Referring to FIG. 4, a sectional view of the semiconductor device 400 according to still another embodiment of the present invention is illustrated.

As illustrated in FIG. 4, the semiconductor device 400 according to still another embodiment of the present invention includes a substrate 110, a first die 420 formed on the substrate 110, an interposer 430 formed on the first semiconductor die 420, a second semiconductor die 440 formed on the interposer 430, side interposers 460 formed on the sides of the second semiconductor die 440, an encapsulant 170, and solder balls 180.

The first semiconductor die 420 is formed on the substrate 110. The first semiconductor die 420 includes bond pads 421 formed thereon, through electrodes 422 connected to the bond pads 421 passing through the semiconductor die 420, and circumferential electrodes 423 positioned at the edges of the first semiconductor die 420 among the through electrodes 422. The first semiconductor die 420 may be flipped so that the bond pads 421 face downward.

The circumferential electrodes 423 of the first semiconductor die 420 are exposed to the sides of the first semiconductor die 420. That is, the circumferential electrodes 423 are exposed through the sides of the first semiconductor die 420 as the edges of the first semiconductor die 420 are removed. The circumferential electrodes 422 may be connected to the side interposers 460.

The interposer 430 is formed on the first semiconductor die 420. The interposer 430 includes first regions 431 formed on the lower side thereof, second regions 432 formed thereon, conductive vias 433 for connecting the first regions 431 and the second regions 432 to each other, integrated circuits 434, and circumferential vias 435 formed on the sides of the interposer 430.

The circumferential vias 435 are formed at the edges of the interposer 430 among the conductive vias 433 and are exposed to the sides of the interposer 430 as the edges of the interposer 430 are removed. The circumferential vias 434 may be connected to the side interposer 460.

The second semiconductor die 440 is formed on the interposer 430. The second semiconductor die 440 is connected to the interposer 430 through conductive bumps 440a by making bond pads 441 face downward.

The second semiconductor die 440 includes circumferential electrodes 442 having the TSV structure and formed at the edges. The circumferential electrodes 442 penetrate the second semiconductor die 440 and are exposed to the sides of the second semiconductor die 440. The circumferential electrodes 442 may be connected to the side interposer 460. In addition, the second semiconductor die 440 may be positioned so that the bond pads 441 face upward.

The side interposer 460 is connected to at least one selected from the group consisting of the first semiconductor die 420, the interposer 430, and the second semiconductor die 440. The side interposer 460 includes first regions 461 formed on one surface, second regions 462 formed on the opposite surface thereof conductive vias 463 for connecting the first regions 461 and the second regions 462 to each other, and integrated circuits 464 connected to the conductive vias 463.

The first regions 461 are connected to the first semiconductor die 420, the interposer 430, and/or the second semiconductor die 440 through conductive bumps 460a. The integrated circuits 464 may perform the same function as the integrated circuits 434 of the interposer 430.

Since the side interposers 460 are positioned on the circumferences of the first semiconductor die 420 and the second semiconductor die 440, it is possible to improve the space usability of the semiconductor device 400 according to still another embodiment of the present invention. Therefore, the side interposers 460 are provided so that it is possible to make the semiconductor device 400 according to still another embodiment of the present invention light, thin, short, and small.

Hereinafter, the structure of a semiconductor device 500 according to still another embodiment of the present invention will be described.

Figure 5:
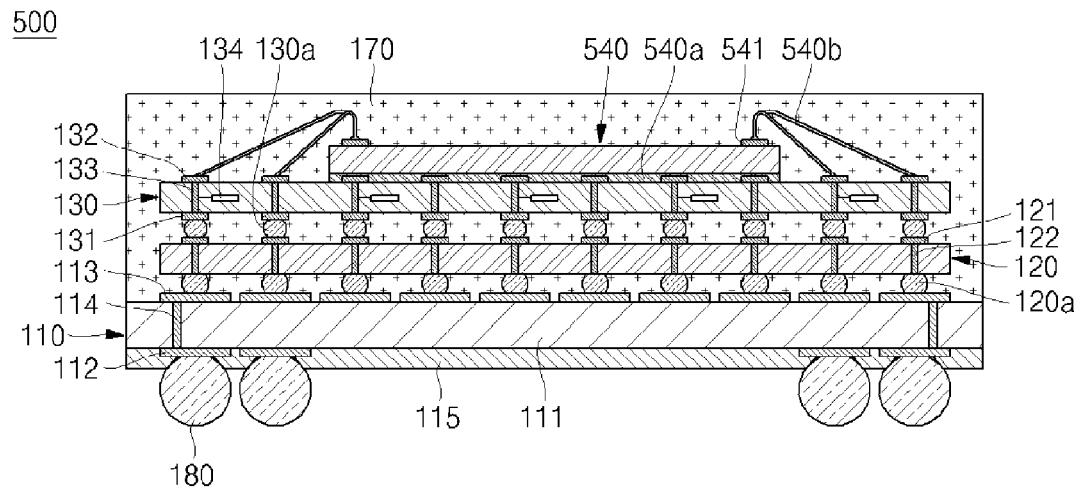
FIG. 5 is a sectional view illustrating a semiconductor device according to still another embodiment of the present invention.

Referring to FIG. 5, a sectional view of the semiconductor device 500 according to still another embodiment of the present invention is illustrated.

As illustrated in FIG. 5, the semiconductor device 500 according to still another embodiment of the present invention includes a substrate 110, a first semiconductor die 120, an interposer 130, a second semiconductor die 540 formed on the interposer 130, an encapsulant 170, and solder balls 180.

The second semiconductor die 540 is formed on the interposer 130. The second semiconductor die 540 is attached onto the interposer 130 by an adhesive 540a. The adhesive 540a electrically insulates the lower surface of the second semiconductor die 540 from the second regions 132 of the interposer 130.

The second semiconductor die 540 is electrically connected to the second regions 132 of the interposer 130 through conductive wires 540b. Therefore, only parts having necessary functions among the integrated circuits 134 of the interposer 130 may be selectively connected to the second semiconductor die 540.

By doing so, the second regions 132 of the interposer 130 are independent of the integrated circuits 134 corresponding to the second regions 132. If necessary, the second regions 132 may be selectively connected through the conductive wires 540b. Therefore, since a fabrication method is simple, a large amount of interposers 130 can be produced.

Hereinafter, the structure of a semiconductor device 600 according to still another embodiment of the present invention will be described.

Figure 6:
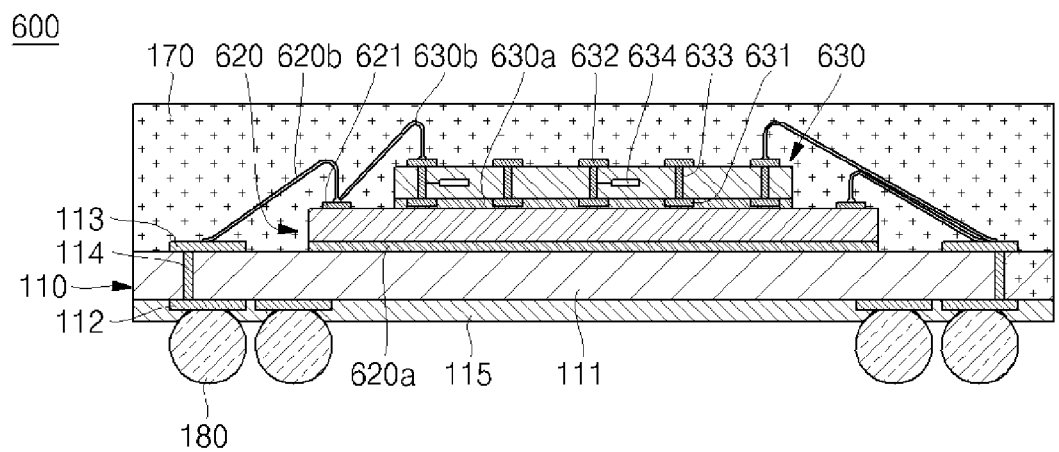
FIG. 6 is a sectional view illustrating a semiconductor device according to a still another embodiment of the present invention.

Referring to FIG. 6, a sectional view of the semiconductor device 600 according to still another embodiment of the present invention is illustrated.

As illustrated in FIG. 6, the semiconductor device 600 according to still another embodiment of the present invention includes a substrate 110, a first semiconductor die 620 formed on the substrate 110, an interposer 630 formed on the first semiconductor die 620, an encapsulant 170, and solder balls 180.

The first semiconductor die 620 is attached onto the substrate 110 by an adhesive 620a. The first semiconductor die 620 includes a plurality of bond pads 621 formed thereon. The bond pads 621 are electrically connected to the conductive patterns 113 of the substrate 110 by conductive wires 620b. In addition, the first semiconductor die 620 having the TSV structure may be formed so that the bond pads 621 face the substrate 110.

The interposer 630 is formed on the first semiconductor die 620. The interposer 630 is attached onto the first semiconductor die 620 by an adhesive 620a.

The interposer 630 includes first regions 631 formed on the lower side thereof, second regions 632 formed thereon, conductive vias 633 for connecting the first regions 631 and the second regions 632 to each other, and integrated circuits 634 connected to the conductive vias 633.

The first regions 631 are electrically independent of the first semiconductor die 620 by the adhesive 620a. The second regions 632 are electrically connected to the substrate 110 and/or the first semiconductor die 620 by the conductive wires 640b.

Hereinafter, the structure of a semiconductor device 700 according to still another embodiment of the present invention will be described.

Figure 7:
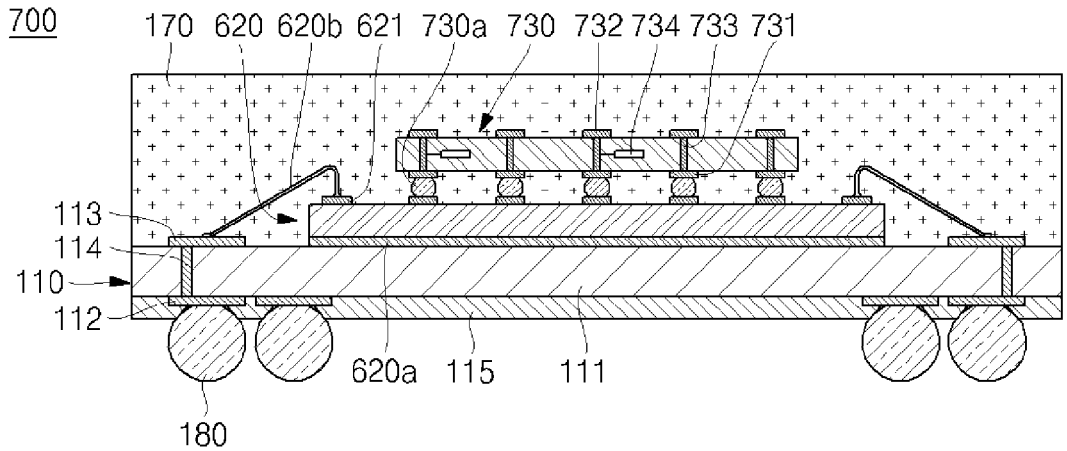
FIG. 7 is a sectional view illustrating a semiconductor device according to still another embodiment of the present invention.

Referring to FIG. 7, a sectional view of the semiconductor device 700 according to still another embodiment of the present invention is illustrated.

As illustrated in FIG. 7, the semiconductor device 700 according to still another embodiment of the present invention includes a substrate 110, a first semiconductor die 620, an interposer 730 formed on the first semiconductor die 620, an encapsulant 170, and solder balls 180.

The interposer 730 is formed on the first semiconductor die 620. The interposer 730 is electrically connected to the bond pads 621 of the first semiconductor die 620 through conductive bumps 730a. To this end, the interposer 730 is aligned with the bond pads 621 of the first semiconductor die 620.

The interposer 730 includes first regions 731 formed on the lower surface thereof, second regions 732 formed thereon, conductive vias 733 for connecting the first regions 731 and the second regions 732 to each other, and integrated circuits 734 connected to the conductive vias 733.

Hereinafter, a method of fabricating the semiconductor device 100 according to an embodiment of the present invention will be described.

Figure 8:
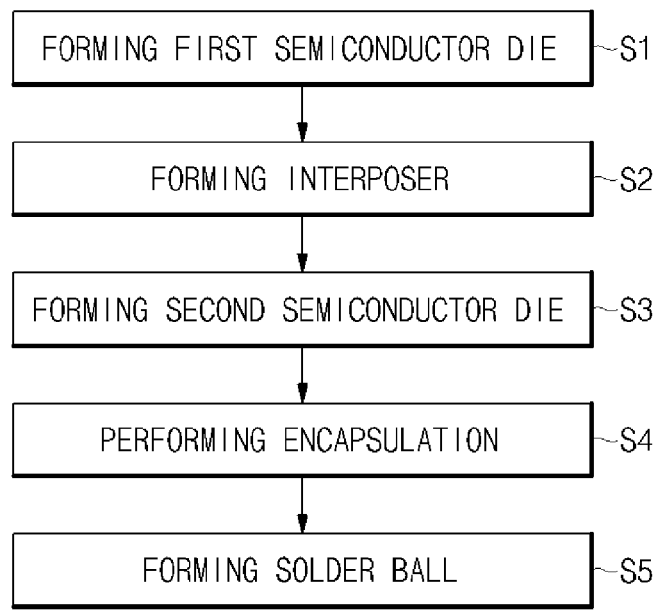
FIG. 8 is a flowchart illustrating a method of fabricating a semiconductor device according to an embodiment of the present invention.

FIG. 8 is a flowchart illustrating a method of fabricating the semiconductor device 100 according to the embodiment of the present invention. FIGS. 9A to 9E illustrate the method of fabricating the semiconductor device 100 according to the embodiment of the present invention.

As illustrated in FIG. 8, the semiconductor device 100 according to the embodiment of the present invention includes forming a first semiconductor die (S1), forming an interposer (S2), forming a second semiconductor die (S3), performing encapsulation (S4), and forming solder balls (S5). Hereinafter, the steps of FIG. 8 will be described with reference to FIGS. 9A to 9E.

Figure 9A:
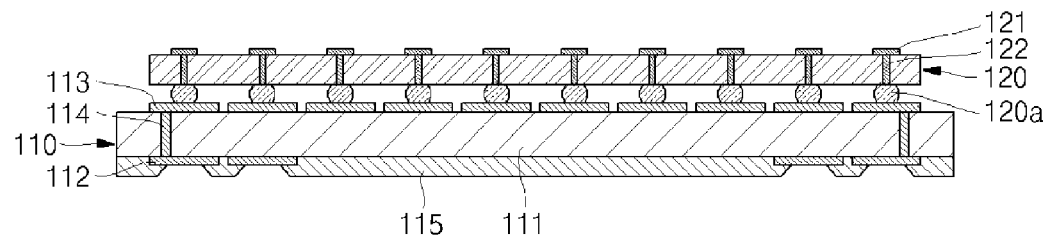
FIGS. 9A to 9E are views illustrating a method of fabricating a semiconductor device according to an embodiment of the present.

Referring to FIGS. 8 and 9A, first, the step (S1) of forming the first semiconductor 120 on a substrate 110 is performed. The first semiconductor die 120 is formed to have the TSV structure. A plurality of bond pads 121 are provided on the first semiconductor die 120. The through electrodes 122 that pass through the first semiconductor die 120 are connected to the bond pads 121. The through electrodes 122 of the first semiconductor die 120 are connected to the conductive patterns 113 of the substrate 110 through conductive bumps 120a.

Figure 9B:
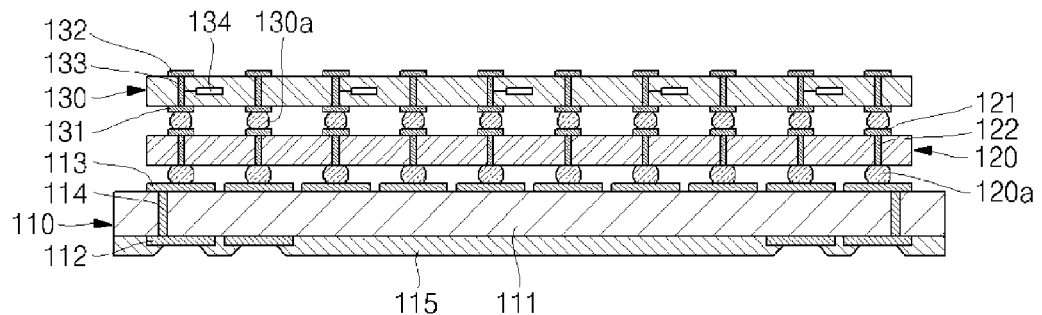

Referring to FIGS. 8 and 9B, then, the step (S2) of forming the interposer 130 on the first semiconductor die 120 is performed. The interposer 130 is formed on the first semiconductor die 120 using the conductive bumps 130a.

The interposer 130 includes first regions 131 formed on the lower surface thereof, second regions 132 formed thereon, conductive vias 133 for connecting the first regions 131 and the second regions 132 to each other, and at least one or more integrated circuits 134 connected to the conductive vias 133. The integrated circuits 134 may perform one function selected among the group consisting of a decoupling capacitor, an ESD preventing circuit, an impedance matching circuit, and termination.

Figure 9C:
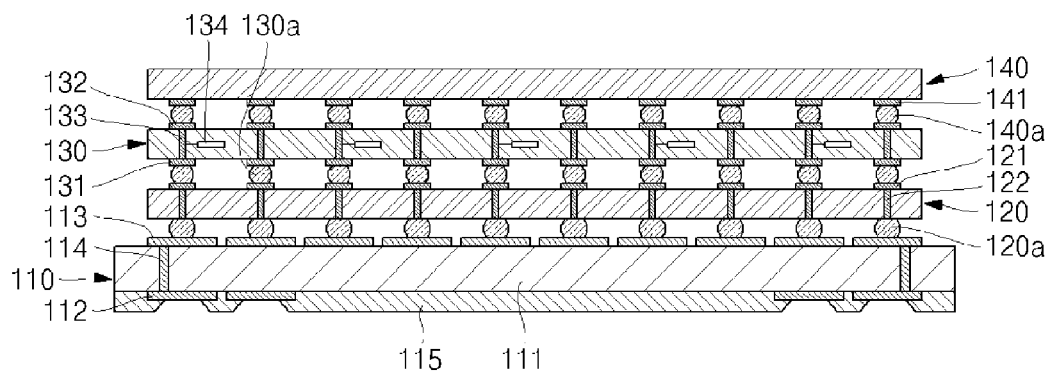

Referring to FIGS. 8 and 9C, the step (S3) of forming the second semiconductor die 140 on the interposer 130 is performed. The second semiconductor die 140 is formed on the interposer 130 using the conductive bumps 140a.

At this time, in the second regions 132 of the interposer 130, channels may be set to the region where the second semiconductor die 140 is attached by wiring lines through fuses. Then, when the remaining wiring lines excluding the wiring lines of the integrated circuits 134 having functions required for the second semiconductor die 140 and the second regions 132 connected thereto are removed by laser, only the integrated circuits 134 having the necessary functions can be connected to the second semiconductor die 140.

Moreover, when the second semiconductor die 140 is connected onto the interposer 130 through conductive wires, it is not necessary for the second regions 132 of the interposer 130 to include additional wiring lines. The second regions 132 of the interposer 130 and the integrated circuits 134 connected thereto may be selectively connected to the second semiconductor die 140 by the conductive wires.

Figure 9D:
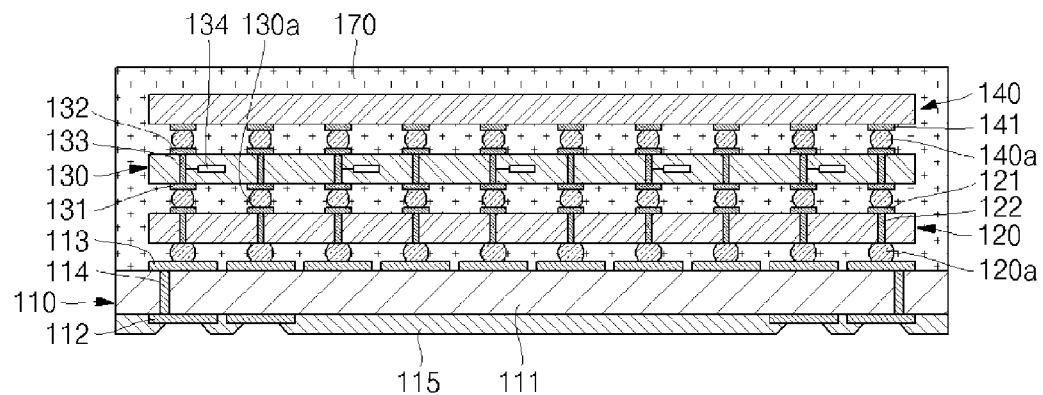

Referring to FIGS. 8 and 9D, the step (S4) of performing encapsulation such that an encapsulant 170 surrounds the first semiconductor die 120, the interposer 130, and the second semiconductor die 140 is performed. The encapsulant 170 used for encapsulation may be formed of common epoxy resin and silicon resin and equivalents thereof. However, the content of the present invention is not limited to the above materials.

Figure 9E:
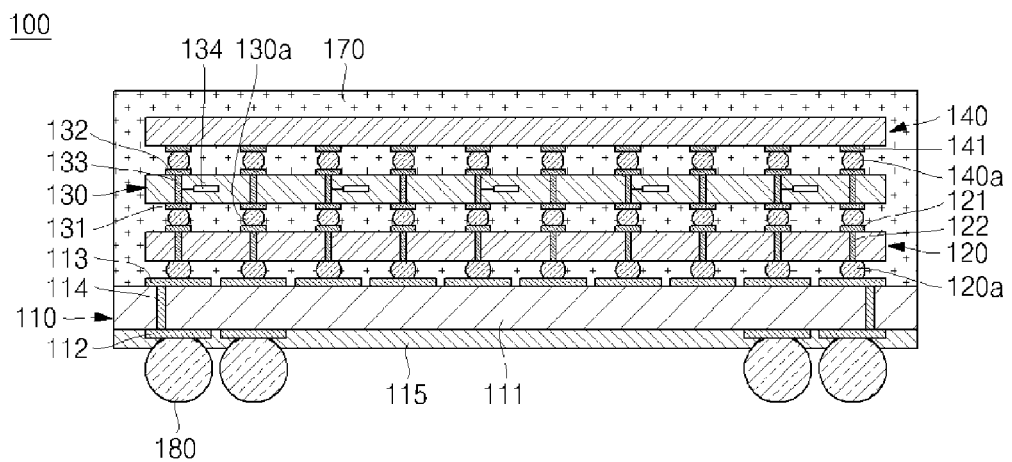

Referring to FIGS. 8 and 9E, the step (S5) of forming solder balls 180 on the lower surface of the substrate 110 is performed. The solder balls 180 are electrically connected to the lands 112 of the substrate 110. The solder balls 180 may be made of at least one selected among the group consisting of tin, lead, silver, and a silver alloy or a combination of the above materials.

As described above, the semiconductor device 100 according to the embodiment of the present invention may be fabricated. In the semiconductor device 100 according to an embodiment of the present invention, the integrated circuits 134 are provided in the interposer 130 to provide the functions of the decoupling capacitor, the ESD preventing circuit, the impedance matching circuit, and the termination and to improve reliability.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device, comprising:
   a substrate including lands provided on the lower surface thereof and conductive patterns electrically connected to the lands thereon;
   a semiconductor die formed on the substrate and electrically connected to the conductive patterns, wherein the semiconductor die has a through silicon via (TSV) structure comprising a plurality of through electrodes that pass through the semiconductor die, each of the plurality of through electrodes being connected to a respective bond pad of the semiconductor die;
   an interposer formed on one of the substrate and the semiconductor die and the interposer including at least one integrated circuit connected to the semiconductor die therein; and
   an encapsulant formed on the substrate to surround the semiconductor die and the interposer.

2. The semiconductor device of claim 1, wherein the semiconductor die is formed such that the bond pads are in one of an upward facing orientation and a downward facing orientation.

3. The semiconductor device of claim 1, wherein the integrated circuit of the interposer is formed of one selected from the group consisting of a decoupling capacitor, an electrostatic discharge (ESD) protecting circuit, an impedance matching circuit, and a termination circuit or a combination of above circuits.

4. The semiconductor device of claim 1, wherein a plurality of integrated circuits of the interposer are selectively connected to the semiconductor die.

5. The semiconductor device of claim 1, wherein the interposer comprises:
   a first region formed on the interposer;
   a second region formed under the interposer; and
   a conductive via connected to the integrated circuit to electrically connect the first region and the second region to each other through the interposer.

6. The semiconductor device of claim 5, wherein the first region and the second region are selectively connected to one of the substrate and the semiconductor die through wiring lines.

7. The semiconductor device of claim 6, wherein the wiring lines are made of one of wires and fuses.

8. The semiconductor device of claim 1, wherein an additional semiconductor die is stacked on the interposer.

9. The semiconductor device of claim 8, wherein the stacked semiconductor die is formed such that the bond pads are in one of an upward facing orientation and a downward facing orientation.

10. The semiconductor device of claim 1, further comprising side interposers electrically connected to the semiconductor die and/or interposer and formed on sides of the semiconductor die and/or interposer.

11. The semiconductor device of claim 10, wherein at least one conductive via is exposed to sides to be electrically connected to the side interposer.

12. The semiconductor device of claim 10, wherein, in the interposer, at least one conductive via is exposed to sides to be electrically connected to the side interposers.

13. The semiconductor device of claim 1, further comprising passive elements formed on and/or under the interposer.

* * * * *